(12) United States Patent
Matsubara et al.

(10) Patent No.: US 11,739,232 B2
(45) Date of Patent: Aug. 29, 2023

(54) CONDUCTIVE PASTE COMPOSITION

(71) Applicant: KYOTO ELEX CO., LTD., Kyoto (JP)

(72) Inventors: Toyoharu Matsubara, Kyoto (JP); Satoru Tomekawa, Kyoto (JP); Takamitsu Arai, Kyoto (JP); Yuta Motohisa, Kyoto (JP); Kimika Gotou, Kyoto (JP)

(73) Assignee: KYOTO ELEX CO., LTD., Kyoto (JP)

( * ) Notice: Subject to any disclaimer, the term of this patent is extended or adjusted under 35 U.S.C. 154(b) by 27 days.

(21) Appl. No.: 17/616,515

(22) PCT Filed: May 27, 2020

(86) PCT No.: PCT/JP2020/020830
§ 371 (c)(1),
(2) Date: Dec. 3, 2021

(87) PCT Pub. No.: WO2020/250675
PCT Pub. Date: Dec. 17, 2020

(65) Prior Publication Data
US 2022/0228015 A1 Jul. 21, 2022

(30) Foreign Application Priority Data

Jun. 12, 2019 (JP) .................... 2019-109432
Apr. 28, 2020 (JP) .................... 2020-079455

(51) Int. Cl.
*C09D 11/52* (2014.01)
*C09D 11/037* (2014.01)
(Continued)

(52) U.S. Cl.
CPC .......... *C09D 11/52* (2013.01); *C08G 59/4207* (2013.01); *C08K 3/08* (2013.01);
(Continued)

(58) Field of Classification Search
CPC combination set(s) only.
See application file for complete search history.

(56) References Cited

U.S. PATENT DOCUMENTS

2014/0346413 A1  11/2014  Inoue et al.

FOREIGN PATENT DOCUMENTS

| JP | 2009099561 A | * | 5/2009 |
| JP | 2012-38846 A | | 2/2012 |
| JP | 2014-5531 A | | 1/2014 |

OTHER PUBLICATIONS

English text machine translation of Tsurumi (JP 2009-099561 A) accessed online from Espacenet.*

(Continued)

*Primary Examiner* — Katie L. Hammer
(74) *Attorney, Agent, or Firm* — Birch, Stewart, Kolasch & Birch, LLP

(57) ABSTRACT

A conductive paste composition includes a conductive powder (A) and a resin component (B). A silver-based powder containing at least silver is used as the conductive powder (A), at least one of a thermosetting resin and a thermoplastic resin is used as the resin component (B). The conductive paste composition further contains a specific ester-based compound (C) having a molecular weight within a range of 150 to 2000 or a specific ether/amine-based compound (D) having a molecular weight within the range of from 150 to 30,000.

6 Claims, 1 Drawing Sheet

(51) Int. Cl.
- *C09D 11/103* (2014.01)
- *C09D 11/108* (2014.01)
- *C08K 5/10* (2006.01)
- *H01B 1/22* (2006.01)
- *C09D 5/24* (2006.01)
- *H05K 1/09* (2006.01)
- *C08G 59/42* (2006.01)
- *C08K 3/08* (2006.01)
- *C08K 13/02* (2006.01)
- *C08K 5/17* (2006.01)

(52) U.S. Cl.
CPC .................. *C08K 5/10* (2013.01); *C08K 5/17* (2013.01); *C08K 13/02* (2013.01); *C09D 5/24* (2013.01); *C09D 11/037* (2013.01); *C09D 11/103* (2013.01); *C09D 11/108* (2013.01); *H01B 1/22* (2013.01); *H05K 1/09* (2013.01); *C08K 2003/0806* (2013.01); *C08K 2201/001* (2013.01)

(56) References Cited

OTHER PUBLICATIONS

International Search Report, issued in PCT/JP2020/020830, PCT/ISA/210, dated Aug. 11, 2020.
Written Opinion of the International Searching Authority, issued in PCT/JP2020/020830, PCT/ISA/237, dated Aug. 11, 2020.

* cited by examiner

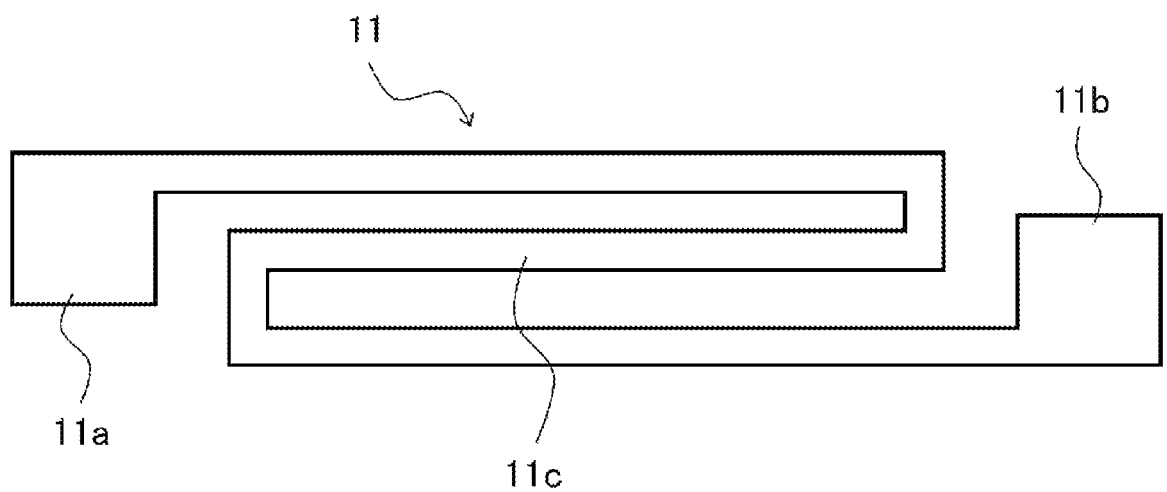

CONDUCTIVE PASTE COMPOSITION

TECHNICAL FIELD

The present invention relates to a resin type conductive paste composition.

BACKGROUND ART

Commonly, as one of methods for forming a conductive layer of an electrode or an electric wiring (wiring) on a base material such as a film, a substrate, an electronic component or the like, a technique using a conductive paste composition has been widely used. Various types of such conductive paste compositions are known, and as one classification method, the conductive paste compositions can be roughly classified into a resin type conductive paste and a sintering type conductive paste.

The sintering type conductive paste is applied to a surface of a substrate (base material) such as ceramic that can be sintered at a high temperature, and is generally sintered at a high temperature of 500° C. or higher, thereby forming a conductive layer as a sintered product on the surface of the substrate. The sintering type conductive paste is subjected to a sintering treatment at a high temperature as described above to form a conductive layer as a sintered product, and thus, the volume resistivity of the obtained conductive layer can be relatively low.

In contrast, the resin type conductive paste is applied to or printed on a base material, and is dried and cured by heating the base material to form a conductive layer as a cured product. It is known that since the resin type conductive paste is subjected to a heat treatment at a relatively low temperature (typically 250° C. or lower) as compared with the sintering type conductive paste, the volume resistivity of the obtained conductive layer (cured product) is relatively high as compared with the sintering type conductive paste.

Some techniques are known for the purpose of reducing the volume resistivity of a resin type conductive paste using a silver powder or a powder using silver (collectively referred to as a silver-based powder) as a conductive powder (conductive particles). For example, Patent Literature 1 discloses a paste for a solar cell electrode, in which a silver powder is used as a conductive powder and a fatty acid silver salt is used in combination, and conditions such as a particle diameter, a shape, and a tap density of the silver powder are adjusted. Patent Literature 2 discloses a silver-coated copper alloy powder as a silver-based powder that can be used for a conductive paste composition, and in this silver-coated copper alloy powder, the copper alloy powder contains nickel or zinc (or both) within a predetermined range in order to reduce the volume resistivity.

CITATION LIST

Patent Literature

Patent Literature 1: JP-A-2012-038846
Patent Literature 2: JP-A-2014-005531

SUMMARY OF INVENTION

Technical Problem

As described above, in Patent Literatures 1 and 2, various conditions for the silver-based powder itself are studied to reduce the volume resistivity of a resin type conductive paste using a silver-based powder. However, these prior art documents do not particularly disclose that components other than the silver-based powder (conductive powder) contribute to a decrease in the volume resistivity.

The present invention has been made to solve such problems, and an object thereof is to provide a resin type conductive paste composition in which a silver-based powder is used as a conductive powder and the volume resistivity of a cured product obtained can be satisfactorily reduced.

Solution to Problem

In order to solve the above problems, a conductive paste composition according to the present invention contains a conductive powder (A) and a resin component (B), in which a silver-based powder containing at least silver is used as the conductive powder (A), at least one of a thermosetting resin and a thermoplastic resin is used as the resin component (B), and the conductive paste composition further contains an ester-based compound (C) or an ether/amine-based compound (D), the ester-based compound (C) having an ester structure represented by the following general formula (1) or (2) in a molecule thereof and having a molecular weight within a range of 150 to 2000.

[Chem. 1]

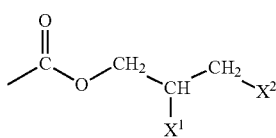

(Here, either one of $X^1$ and $X^2$ in the ester structure of the above general formula (1) or (2) represents Cl or Br. and the other one represents Cl, Br, H, or OH), and the ether/amine-based compound (D) having an ether structure represented by the following general formula (3) or an amine structure represented by the following general formula (4) in a molecule thereof and having a molecular weight within the range of 150 to 30,000.

[Chem. 2]

(Here, Y in the ether structure of the above general formula (3) or the amine structure of the above general formula (4) represents either one of alcohol structures represented by the following general formulae (5A) and (5B),

[Chem. 3]

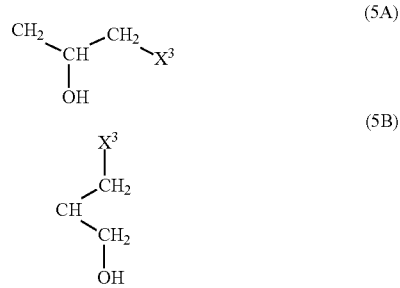

(Z in the amine structure of the above general formula (4) is either one of the alcohol structures represented by the general formulae (5A) and (5B), or a hydrogen atom (H), and $X^3$ in the general formulae (5A) and (5B) each independently represent Cl or Br.)

According to the above configuration, the volume resistivity of the cured product of the conductive paste composition can be lowered without adjusting the conditions of the silver-based powder by incorporating the ester-based compound (C) having the ester structure represented by the general formula (1) or (2), or the ether/amine-based compound (D) into the resin type conductive paste in which the conductive powder (A) is a silver-based powder and the resin component (B) is heated and cured. Accordingly, the volume resistivity of the conductive layer such as an electrode or an electric wiring formed using the conductive paste composition can be made lower. In addition, for example, even when a silver-coated powder instead of a silver powder is used as the silver-based powder, the volume resistivity of the cured product can be satisfactorily lowered, and thus a conductive layer having satisfactory properties can be produced even when the amount of silver used is reduced.

In the conductive paste composition having the above-described configuration, when a total amount of the conductive powder (A) and the resin component (B) is 100 parts by mass, a content of the ester-based compound (C) or a salt thereof or the ether/amine-based compound (D) may be 0.01 parts by mass or more and 5 parts by mass or less.

In the conductive paste composition having the above-described configuration, the content of the ester-based compound (C) or a salt thereof, or the ether/amine-based compound (D) may be 0.1 parts by mass or more and 2.5 parts by mass or less.

In the conductive paste composition having the above-described configuration, the silver-based powder may be at least one of a silver powder and a silver-coated powder.

In the conductive paste composition having the above-described configuration, the ester-based compound (C) may contain the ester-based compound (C) having a salt structure in which a part of the ester structure of the ester-based compound (C) is a salt structure formed by neutralizing a carboxylic acid by a base instead of an ester.

In the conductive paste composition having the above-described configuration, the resin component (B) may be at least one selected from a butyral resin, an epoxy resin, and a phenol resin.

Advantageous Effects of Invention

With the above configuration, the present invention can provide a resin type conductive paste composition in which a silver-based powder is used as the conductive powder and by which the volume resistivity of the obtained cured product can be satisfactorily lowered.

BRIEF DESCRIPTION OF DRAWINGS

FIG. 1 is a plan view showing the shape of a conductor pattern for evaluating the volume resistivity of a conductor pattern (cured product) obtained by curing a conductive paste composition according to an example of the present invention.

DESCRIPTION OF EMBODIMENTS

A conductive paste composition according to the present disclosure contains a conductive powder (A) and a resin component (B), and is a composition (resin type conductive paste) used to form a cured product having conductivity by curing at least the resin component (B) by heating. As the conductive powder (A), a silver-based powder containing at least silver is used, and as the resin component (B), at least one of a thermosetting resin and a thermoplastic resin is used. The conductive paste composition further contains an ester-based compound (C) having an ester structure represented by the following general formula (1) or (2) in a molecule thereof and having a molecular weight within a range of 150 to 2000, or an ether/amine-based compound (D) having an ether structure represented by the following general formula (3) or an amine structure represented by the following general formula (4) in a molecule thereof and having a molecular weight within a range of 150 to 30,000.

[Chem. 4]

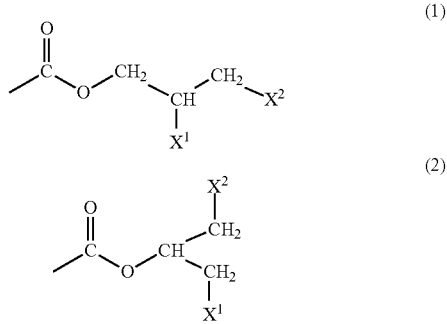

Here, either one of $X^1$ and $X^2$ in the ester structure represented by the above general formula (1) or (2) represents Cl or Br, and the other one represents Cl, Br, H, or OH.

[Chem. 5]

Here, Y in the ether structure of the above general formula (3) or the amine structure of the above general formula (4) represents either one of alcohol structures represented by the following general formulae (5A) and (51B).

[Chem. 6]

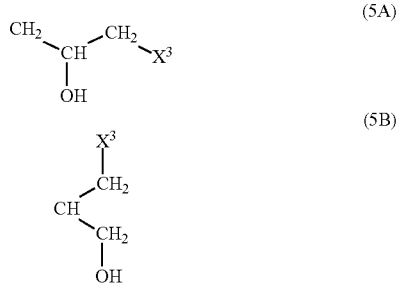

In addition, Z in the amine structure of the general formula (4) is either one of the alcohol structures represented by the general formulae (5A) and (5B), or a hydrogen atom (H), and $X^3$ in the general formulae (5A) and (5B) each independently represent Cl or Br.

In the conductive paste composition according to the present disclosure, a content of the ester-based compound (C) or the ether/amine-based compound (D) is not particularly limited. Typically, when the total amount of the conductive powder (A) and the resin component (B) is 100 parts by mass, the content of the ester-based compound (C) or the ether/amine-based compound (D) may be 0.01 parts by mass or more and 5 parts by mass or less. In addition, the ester-based compound (C) contains the ester-based compound (C) having a salt structure in which a part of the ester structure of the ester-based compound (C) is a salt structure formed by neutralizing a carboxylic acid by a base instead of an ester. Hereinafter, the conductive paste composition according to the present disclosure will be specifically described.

[Conductive Powder (A)]

As the conductive powder (A) contained in the conductive paste composition according to the present disclosure, a powder containing at least silver is used. For convenience of description, the powder containing silver is appropriately referred to as "silver-based powder". Specific examples of the silver-based powder include a silver powder substantially formed of silver, a silver-coated powder obtained by coating a surface of a powder (main powder) formed of a material other than silver with silver, and a silver alloy powder formed of an alloy containing silver (silver alloy). Among these, the silver powder and the silver-coated powder are particularly preferably used.

The silver powder is a powder composed only of silver, and it is needless to say that the silver powder may contain known inevitable impurities. In addition, even in the case of the silver alloy powder, a silver alloy powder having a purity that is recognized as "being made of silver" in various known standards can be handled as a silver powder in the present disclosure.

A specific configuration of the silver-coated powder is not particularly limited, and a material of the main powder formed of a material other than silver may be metal or a material other than metal. Examples of the material other than metal include known resin materials, known ceramic materials, and glass. In the case where the main powder is a resin material, any resin material can be used as long as the resin material has heat resistance to such an extent that a powder shape (particle shape) can be maintained even at a heating temperature in curing the conductive paste composition according to the present disclosure.

Examples of the silver-coated powder in which the main powder is metal, that is, the silver-coated metal powder include a silver-coated copper powder, a silver-coated copper alloy powder, a silver-coated nickel powder, and a silver-coated aluminum powder, but are not particularly limited. Examples of the silver-coated powder in which the main powder is a resin, that is, the silver-coated resin powder include a silver-coated polyimide resin powder, but are not particularly limited. Examples of the silver-coated powder in which the main powder is a ceramic material, that is, the silver-coated ceramic powder include a silver-coated alumina powder, but are not particularly limited.

When the silver-based powder is a silver-coated powder, the amount of silver with which the surface of the main powder is coated, that is, the silver coating amount is not particularly limited, and can be appropriately set depending on various conditions. The silver coating amount may be increased or decreased in accordance with the volume resistivity or the like required in accordance with the use (the application of the cured product) of the conductive paste composition according to the present disclosure. Alternatively, the silver coating amount may be increased or decreased in accordance with the material (conductivity) of the main powder. The silver coating amount can be expressed as a ratio (mass ratio, for example, percentage (mass %)) of the mass of applied silver to the total mass of the silver-coated powder.

The specific shape of the silver-based powder is not particularly limited, and may be spherical (granular) or a flake shape (flaky or scaly shape). Note that the flake-shaped powder may be a powder having a shape close to a flat plate shape or a thin rectangular parallelepiped when viewed as a whole even if the powder is partially uneven and deformed. The spherical powder may be a powder having a three-dimensional shape closer to a cube than a rectangular parallelepiped when viewed as a whole even if the spherical powder is partially uneven and deformed.

The specific physical properties of the silver-based powder are not particularly limited, and the average particle diameter, the specific surface area, and the tap density thereof may be within known ranges. For example, when the shape of the silver-based powder is a flake shape, the average particle diameter D50 may be, for example, within the range of 2 to 20 μm, the BET specific surface area may be, for example, within the range of 0.1 to 2.0 $m^2/g$, the tap density may be, for example, within the range of 3 to 10 $g/cm^3$, and the aspect ratio may be, for example, within the range of 5 to 15. When the shape of the silver-based powder is spherical, the average particle diameter D50 may be within the range of 0.1 to 10 μm, the BET specific surface area may be within the range of 0.5 to 2.0 $m^2/g$, the tap density may be, for example, within the range of 1.5 to 10 $g/cm^3$, and the aggregation degree D50/DSEM may be, for example, within the range of 2 to 15.

A method for measuring (evaluating) the average particle diameter D50 of the silver-based powder is not particularly limited, and in the present disclosure, the average particle diameter D50 may be measured (evaluated) by a laser diffraction method for which a microtrack particle diameter distribution measuring apparatus is used, as in Examples described later. A method for evaluating the BET specific surface area is not particularly limited, and the BET specific surface area may be measured and evaluated by a BET one-point method according to nitrogen adsorption using a known specific surface area meter. In addition, a method for evaluating the tap density is not particularly limited, and tapping may be performed under a predetermined condition using a known tap density measuring apparatus, and the tap density may be calculated and evaluated based on the mass of a sample relative to the volume of the sample after the tapping. As the various conditions in the measurement method or the evaluation method, conditions known in the field of the resin type conductive paste (for example, various conditions described in the publication of the prior patent application of the resin type conductive paste (thermosetting type or the like) filed by the applicant of the present application) can be used.

The method for producing the silver-based powder is not particularly limited and a known method can be used regardless of whether the silver-based powder is a silver powder (or a silver alloy powder) or a silver-coated powder, or regardless of whether the silver-based powder has a flake shape or a spherical shape.

In the case where the silver powder (or the silver alloy powder) is a flake-shaped powder, for example, a spherical powder produced by a known method is used as an original powder, and the original powder is subjected to a known mechanical treatment to produce the flake-shaped powder. The physical properties such as the particle diameter and the aggregation degree of the original powder can be appropriately selected in accordance with, for example, the purpose of use of the conductive paste composition (the type of an electrode or an electric wiring which is a cured product, the type of an electronic component or an electronic device including the electrode or the electric wiring, or the like).

The production method of the silver powder is not particularly limited even in the case where the silver powder (or silver alloy powder) is a spherical powder, and examples of the spherical powder include a powder produced by a wet reduction method, and a spherical powder produced by other known methods such as an electrolysis method and an atomization method. In the case of the silver-coated powder, a surface of the flake-shaped or spherical main powder produced as described above may be coated with silver by a known method.

In the conductive paste composition according to the present disclosure, as the conductive powder (A), at least a silver-based powder is used, and a conductive powder other than the silver-based powder may be used in combination. Examples of the other conductive powder include a gold powder, a palladium powder, a nickel powder, an aluminum powder, a lead powder, and a carbon powder, but are not particularly limited. In the case where the other conductive powder other than the silver-based powder is used in combination, the silver-based powder may be contained in an amount of at least more than 10 mass %, may be contained in an amount of 50 mass % or more, may be contained in an amount of 90 mass % or more, or may be contained in an amount of 95 mass % or more, based on all the conductive powders (A). The blending amount when the other conductive powder is used in combination can be appropriately set in accordance with various conditions required for the obtained cured product.

[Resin Component (B)]

Examples of the resin component (B) contained in the conductive paste composition according to the present disclosure include known resins that can be cured by heating. Specific examples thereof include known thermosetting resins and known thermoplastic resins.

Typical examples of the thermosetting resins include an epoxy resin, a phenol resin, a melamine resin, an unsaturated polyester resin, a maleimide resin, a polyurethane resin, a diallyl phthalate resin, a silicone resin, and a cyanate resin, but are not particularly limited. Only one kind of these thermosetting resins may be used, or two or more kinds thereof may be used in combination accordingly.

In the case where an epoxy resin is used as the resin component (B), a blocked polyisocyanate compound may be used in combination. Therefore, in the present disclosure, the blocked polyisocyanate compound may also be regarded as the resin component (B) for the sake of convenience. One preferred example of these thermosetting resins includes an epoxy resin, a phenol resin, and a combination of an epoxy resin and a blocked polyisocyanate.

The epoxy resin is not particularly limited as long as it is a polyvalent epoxy resin having two or more epoxy rings or epoxy groups in one molecule, and a general epoxy resin can be used. Specific examples thereof include glycidyl type epoxy resins, alicyclic epoxy resins such as dicyclopentadiene epoxide, and aliphatic epoxy resins such as butadiene dimer diepoxide. Examples of the glycidyl type epoxy resin include those obtained by causing epichlorohydrin or 2-methylepichlorohydrin to react with the following compounds: a novolac compound such as phenol novolac and cresol novolac; a polyvalent phenolic compound such as bisphenol, hydrogenated bisphenol A, bisphenol F, bisphenol AD, and resorcin; a polyhydric alcohol compound such as ethylene glycol, neopentyl glycol, glycerin, trimethylolpropane, pentaerythritol, triethylene glycol, and polypropylene glycol; a polyamino compound such as ethylenediamine, triethylenetetramine, and aniline; or a polyvalent carboxyl compound such as adipic acid, phthalic acid, and isophthalic acid. Only one kind of these epoxy resins may be used, or two or more kinds thereof may be used in combination accordingly.

The epoxy equivalent of the epoxy resin is not particularly limited, and can be typically within the range of 100 to 1000. The epoxy equivalent of the epoxy resin may be within the range of 100 to 400. When the epoxy equivalent is less than 100, heat resistance, durability, or the like of a cured product formed using the obtained conductive paste composition may be affected. On the other hand, when the epoxy equivalent is more than 1000, the thixotropy of the obtained conductive paste composition tends to decrease.

As the phenol resin, a known resin obtained by causing phenols to react with aldehydes can be suitably used. Typical examples thereof include a novolac type phenol resin, a resol type phenol resin, a trisphenyl methane type phenol resin, a naphthalene type phenol resin, a cyclopentadiene type phenol resin, and an arylalkylene type phenol resin. Among these, in particular, a novolac type phenol resin or a resol type phenol resin is generally used.

The novolac type phenol resin is not particularly limited as long as it is obtained by causing a known phenol to react with a known aldehyde using an acidic catalyst.

The phenols used for the novolac type phenol resin are not particularly limited, and examples thereof include phenol, cresol, xylenol, ethylphenol, p-phenylphenol, p-tert-butylphenol, p-tert-amylphenol, p-octylphenol, p-nonylphenol, p-cumylphenol, bisphenol A, bisphenol F. and resorcinol. Only one kind of these phenols may be used, or two or more kinds thereof may be used in combination accordingly.

The aldehydes used in the novolac type phenol resin are not particularly limited, and examples thereof include alkyl aldehydes such as formaldehyde, acetaldehyde, propylaldehyde, and butylaldehyde; and aromatic aldehydes such as benzaldehyde and salicylaldehyde. Only one kind of these aldehydes may be used, or two or more kinds thereof may be used in combination accordingly.

In the production of the novolac type phenol resin, the acidic catalyst for causing phenols to react with aldehydes is not particularly limited, and a known organic sulfonic acid, inorganic acid, or the like can be suitably used. The molar ratio at the time of causing the phenols to react with the aldehydes is not particularly limited, and a known molar ratio can be selected.

The resol type phenol resin is not particularly limited as long as it is obtained by causing known phenols to react with known aldehydes using a catalyst such as an alkali metal, an amine, or a divalent metal salt.

The phenols used for the resol type phenol resin are not particularly limited, and examples thereof include phenol; cresols such as, o-cresol, m-cresol, and p-cresol; xylenols such as 2,3-xylenol, 2,4-xylenol, 2,5-xylenol, 2,6-xylenol, 3,4-xylenol, and 3,5-xylenol; ethylphenols such as o-ethylphenol, m-ethylphenol, and p-ethylphenol; butylphenols such as isopropylphenol, butylphenol, and p-tert-butylphenol; alkylphenols such as p-tert-amylphenol, p-octylphenol, p-nonylphenol, and p-cumylphenol; halogenated phenols such as fluorophenol, chlorophenol, bromophenol, and iodophenol; substituted monohydric phenol such as p-phenylphenol, aminophenol, nitrophenol, dinitrophenol, and trinitrophenol; monohydric phenols such as 1-naphthol and 2-naphthol; and polyhydric phenols such as resorcin, alkylresorcin, pyrogallol, catechol, alkylcatechol, hydroquinone, alkylhydroquinone, phloroglucin, bisphenol A, bisphenol F, bisphenol S, and dihydroxynaphthalene. Only one kind of these phenols may be used, or two or more kinds thereof may be used in combination accordingly.

The aldehydes used for the resol type phenol resin are not particularly limited, and examples thereof include formaldehyde, paraformaldehyde, trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, and salicylaldehyde. Only one kind of these aldehydes may be used, or two or more kinds thereof may be used in combination accordingly.

In the production of the resol type phenol resin, various catalysts for causing phenols to react with aldehydes are not particularly limited. Specific examples thereof include hydroxides, oxides, carbonates, known low molecular weight organic amines, and divalent metal acetates of metal elements of Group 1 or Group 2 of the Periodic Table. The molar ratio between the phenols and the aldehydes in the reaction of them is not particularly limited, and a known molar ratio can be selected.

The blocked polyisocyanate compound used in combination with the epoxy resin is not particularly limited as long as it is obtained by blocking an isocyanate group of a known polyisocyanate compound.

Typical examples of the polyisocyanate compound include aromatic isocyanate compounds such as tolylene diisocyanate, diphenylmethane diisocyanate, polymethylene polyphenyl polyisocyanate, tolydine diisocyanate, xylylene diisocyanate, and naphthalene diisocyanate, and aliphatic polyisocyanate compounds such as hexamethylene diisocyanate, isophorone diisocyanate, hydrogenated xylylene diisocyanate, dicyclohexylmethane diisocyanate, octamethylene diisocyanate, and trimethylhexamethylene diisocyanate. Only one kind of the blocked polyisocyanate compounds using these polyisocyanate compounds may be used, or two or more kinds thereof may be used in combination accordingly.

As the polyisocyanate compounds, a terminal isocyanate group-containing compound synthesized by causing a polyisocyanate to react with a polyol according to a known method can be used. For example, in the examples described below, a reaction compound of an isocyanurate type polyisocyanate of hexamethylene diisocyanate and a polypropylene polyol is used as the blocked polyisocyanate.

The polyol used for synthesizing a blocked polyisocyanate containing a terminal isocyanate group by causing a polyisocyanate to react with a polyol is not particularly limited, and known polyether polyols, polyester polyols, and polycarbonate polyols can be suitably used. The blocking agent of the polyisocyanate compound is not particularly limited, and known compounds such as imidazoles, phenols, and oximes that are known can be suitably used (methylethylketone oxime is used in Examples).

In the case where the epoxy resin and the blocked polyisocyanate compound are used in combination, the weight mixing ratio thereof is not particularly limited, and a known mixing ratio can be appropriately selected. Typically, when the total amount of the epoxy resin and the blocked polyisocyanate compound is 100 parts by mass, the ratio of the amount of the epoxy resin to the amount of the blocked polyisocyanate compound (parts of mass of the epoxy resin:parts of mass of the blocked polyisocyanate compound) is within the range of 30:70 to 90:10. The parts by mass of the epoxy resin and the parts by mass of the blocked polyisocyanate compound referred to herein include not only the case of using only one kind of these resins or compounds but also the case of using a plurality of kinds of these resins or compounds.

Typical examples of the thermoplastic resin include a butyral resin, an acrylic resin, a polystyrene resin, a polycarbonate resin, a polyacrylamide resin, and a polyamide-imide resin, but are not particularly limited. Only one kind of these thermoplastic resins may be used, or two or more kinds thereof may be used in combination accordingly. Among these thermoplastic resins, a butyral resin can be mentioned as one preferred example.

The butyral resin may be a polymer containing a butyral group, a hydroxyl group, and an acetic acid group as a structure of monomer units, and is generally synthesized by causing polyvinyl alcohol to react with butylaldehyde. The butyral resin may be modified by a known method, or may contain a structure other than a butyral group, a hydroxyl group, and an acetic acid group as the structure of the monomer units.

In the conductive paste composition according to the present disclosure, as the resin component (B), at least one thermosetting resin described above or at least one thermoplastic resin described above may be used, and a thermosetting resin and a thermoplastic resin may be used in combination. That is, a mixture (composition or polymer alloy) obtained by combining at least one thermosetting resin and at least one thermoplastic resin can also be used.

[Curing Agent for Thermosetting Resin]

In the case where the resin component (B) described above is a thermosetting resin, a known curing agent can be used to cure the thermosetting resin. The kind of the curing agent is not particularly limited, and a known curing agent can be appropriately used in accordance with the kind of the thermosetting resin. For example, in the case where the epoxy resin described above or the epoxy resin and the blocked polyisocyanate compound are used as the thermosetting resin, specific examples of the curing agent include imidazoles, Lewis acids containing boron fluoride and complexes or salts thereof, amine adducts, tertiary amines, dicyandiamides, phenol resins, and acid anhydrides.

Specific examples of the imidazoles among these curing agents include imidazole, 2-methylimidazole, 2-ethyl-4- methylimidazole, 2-undecylimidazole, 2-heptadecylimidazole, 1-benzyl-2-methylimidazole, 2-phenyl-4-methylimidazole, 1-cyanoethyl-2-methylimidazole, 1-aminoethyl-2-methylimidazole, 1-methylimidazole, and 2-ethylimidazole.

Specific examples of the Lewis acid containing boron fluoride and the complexes or salts thereof include boron trifluoride ethyl ether, boron trifluoride phenol, boron trifluoride piperidine, a boron trifluoride acetic acid complex, boron trifluoride triethanolamine, boron trifluoride monoethanolamine, and boron trifluoride monoethylamine.

Specific examples of the amine adducts include Amicure series (product name) manufactured by Ajinomoto Fine-Techno Co., Inc., and Fujikura series (product name) manufactured by Fuji Kasei Kogyo Co., Ltd.

Specific examples of the tertiary amines include dimethyloctylamine, dimethyldecylanune, dimethyllaurylamine, dimethylmyristylamine, dimethylpalmitylamine, dimethylstearylamine, dimethylbehenylamine, dilaurylmonoethylamine, methyldidecylamine, methyldiorailamine, triallylamine, triisopropanolamine, triethylamine, 3-(dibutylamino) propylamine, tri-n-octylamine, 2,4,6-tris-dimethylaminomethylphenol, triethanolamine, methyldiethanolamine, and diazabicycloundecene.

Specific examples of the phenol resins as the curing agent include JER170 (product name) and JER171N (product name) manufactured by Mitsubishi Chemical Corporation, and MEH-8000H (product name) and MEH-8005 (product name) manufactured by Meiwa Plastic Industries, Ltd.

Specific examples of the acid anhydrides include phthalic anhydride, maleic anhydride, cis-1,2,3,6-tetrahydrophthalic anhydride, trimellitic anhydride, pyromellitic anhydride, and RIKACID MH-700 (product name) and RIKACID HNA-100 (product name) manufactured by New Japan Chemical Co., Ltd.

Only one kind of these curing agents may be used, or two or more kinds thereof may be used in combination accordingly. The addition amount of these curing agents is not particularly limited, and examples thereof include an addition amount within a range of 3 to 30 parts by mass of the curing agent with respect to 100 parts by mass of a thermosetting resin such as an epoxy resin (in Examples described later, the unit of the addition amount of the curing agent is described as phr (per hundred resin) in the same meaning). Although it depends on the kind of the thermosetting resin, in the case where the addition amount of the curing agent is less than 3 parts by mass, curing of the thermosetting resin may be insufficient, and good conductivity may not be obtained for the cured product (conductive layer). On the other hand, in the case where the addition amount of the curing agent exceeds 30 parts by mass, the paste viscosity of the conductive paste composition may increase.

[Ester-Based Compounds (C)]

The ester-based compound (C) contained in the conductive paste composition according to the present disclosure may be a compound having an ester structure represented by the following general formula (1) or (2) in the molecule and having a molecular weight within the range of 150 to 2000.

[Chem. 7]

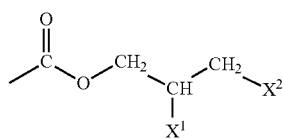
(1)

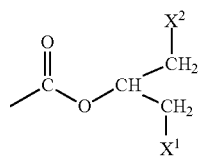
(2)

Either one of $X^1$ and $X^2$ in the ester structure represented by the above general formula (1) or (2) represents Cl or Br, and the other one represents Cl, Br, H or OH. That is, the ester structure contains at least one chlorine atom (Cl) or at least one bromine atom (Br).

The specific production (synthesis) method for the ester-based compound (C) used in the present disclosure is not particularly limited, and the ester-based compound (C) can be produced by causing a compound for introducing an ester structure (esterification raw material) to react with a compound having a carboxylic acid (a carboxyl group) (raw material carboxylic acid) by a known method.

At this time, when only the esterification raw material is used, the "ester-based compound (C)" is obtained, and when a neutralizing agent is used in combination with the esterification raw material, apart of the carboxylic acids is esterified and apart of the carboxylic acids is neutralized with the neutralizing agent to form a salt. Therefore, the ester-based compound (C) having a salt structure may be obtained by using a neutralizing agent in combination. It can be said that the ester compound (C) is a compound in which a part of the ester structure of the ester-based compound (C) is a salt structure formed by neutralizing a carboxylic acid by a base instead of an ester.

The raw material carboxylic acid is not particularly limited as long as it is a compound having a carboxylic acid in a structure thereof, and typical examples thereof include: saturated aliphatic monocarboxylic acids such as butanoic acid (butyric acid), isobutyric acid, valeric acid (pentanoic acid), isovaleric acid, pivalic acid, lauric acid (dodecanoic acid), palmitic acid (hexadecanoic acid), stearic acid (octadecanoic acid), and hexahydrophthalic acid (cyclohexane-1,2-dicarboxylic acid); saturated aliphatic dicarboxylic acids such as succinic acid, glutaric acid, and adipic acid, and anhydrides thereof, unsaturated aliphatic carboxylic acids such as crotonic acid, oleic acid, maleic acid, and fumaric acid; aromatic carboxylic acids such as benzoic acid, phthalic acid or anhydride thereof, isophthalic acid, terephthalic acid, and pyromellitic acid; hydroxy acids such as malic acid, hydroxybutyric acid, tartaric acid, citric acid, salicylic acid, and gallic acid; ethylenediaminetetraacetic acid; and polymers containing carboxylic acids, such as styrene-maleic acid copolymers. Only one kind of these raw material carboxylic acids may be used, or two or more kinds thereof may be used in combination accordingly.

As is clear from the general formula (1) or (2), the esterification raw material may be any material as long as one hydrogen atom bonded to at least one of two carbon atoms other than a carbon atom to which a hydroxyl group (hydroxy group) is bonded is substituted with at least one of chlorine and bromine atoms in a monohydric or dihydric alcohol having 3 carbon atoms (that is, propanol or propanediol).

Specific examples thereof include 3-chloro-1-propanol, 3-bromo-1-propanol, 2,3-dichloro-1-propanol, 2,3-dibromo-1-propanol, 2-chloro-3-bromo-1-propanol, 2-bromo-3-chloro-1-propanol, 1-chloro-2-propanol, 1-bromo-2-propanol, 1,3-dichloro-2-propanol, 1,3-dibromo-2-propanol, 1-chloro-3-bromo-2-propanol, 3-chloro-1,2-propanediol, and 3-bromo-1,2-propanediol. Only one kind of these halogenated alcohol compounds may be used, or two or more kinds thereof may be used in combination accordingly.

The charged amount of the esterification raw material with respect to the raw material carboxylic acid may be determined by adjusting the amount by mole of the hydroxyl group (hydroxy group) of the esterification raw material on the basis of the amount by mole of the carboxyl group (carboxy group) of the raw material carboxylic acid. For example, when the raw material carboxylic acid is a monocarboxylic acid and the esterification raw material is a monool, 1 mol of the esterification raw material may be charged per 1 mol of the raw material carboxylic acid. Alternatively, when the raw material carboxylic acid is a dicarboxylic acid and the esterification raw material is a monool, 2 moles of the esterification raw material may be charged per 1 mole of the raw material carboxylic acid. Alternatively, when the raw material carboxylic acid is a dicarboxylic acid and the esterification raw material is a diol, 1 mol of the esterification raw material may be charged per 1 mol of the raw material carboxylic acid.

As the esterification raw material, alcohols other than the above halogenated alcohol compound may be used in combination. For example, octanol, octyl diglycol, glycidol, and the like are used in combination in Examples described later (the ester-based compounds (C) represented by abbreviations C09 to C11). The amount of the other alcohol to be used in combination with the halogenated alcohol compound is not particularly limited.

Here, in the case where the ester-based compound (C) has a "salt structure", a neutralizing agent (base) may be used when the raw material carboxylic acid reacts with the esterification raw material, as exemplified as a compound represented by an abbreviation C13 in Examples described later. When the esterification raw material and the neutralizing agent are used in combination, a part of the raw material carboxylic acids is esterified and a part of the raw material carboxylic acids is neutralized with the neutralizing agent to form a salt. At this time, a part of the hydroxyl groups remains in the structure derived from the esterification raw material esterified with the carboxylic acid (in the case where the other one of $X^1$ and $X^2$ is OH in the ester structure represented by the general formula (1) or (2)).

Specific kinds of the neutralizing agent (base) used in combination with the esterification raw material are not particularly limited, and examples thereof include various amine salts such as triethanolamine salts, ethylamine salts, and ammonium salts; and various metal salts such as sodium, potassium, calcium, silver, and copper. The using amount (charged amount) of the neutralizing agent to be used in combination is not particularly limited, and can be appropriately set depending on the specific salt structure contained in the ester-based compound (C). For example, in the case of the ester-based compound (C) represented by the abbreviation C13 in Examples described later, 1 mol of diol (3-chloro-1,2-propanediol) that is an esterification raw material and 1 mol of a neutralizing agent (triethanolamine salt) are charged per 1 mol of succinic anhydride that is a dicarboxylic acid.

The molecular weight of the ester-based compounds (C) may be within the range of 150 to 2000 as described above, and may be within the range of 150 to 1500, or may be within the range of 150 to 1000. In consideration of the ester structure represented by the general formula (1) or (2), it can be determined that the molecular weight of the ester-based compounds (C) of less than 150 is too small. When the molecular weight exceeds 2000, the effect of lowering the volume resistivity of a cured product of the conductive paste composition according to the present disclosure may not be sufficiently obtained, as is clear from Examples described later. Although it depends on the kind of the ester-based compounds (C), the effect of lowering the volume resistance value may be relatively improved as long as the upper limit of the molecular weight is 1500 or less or 1000 or less.

[(D) Ether/Amine-Based Compound]

The ether/amine-based compound (D) contained in the conductive paste composition according to the present disclosure may be an ether-based compound having an ether structure represented by the following general formula (3) in the molecule and having a molecular weight within the range of 150 to 30,000, or an amine-based compound having an amine structure represented by the following general formula (4) in the molecule and having a molecular weight within the range of 150 to 30,000.

[Chem. 8]

Y in the ether structure of the general formula (3) or the amine structure of the general formula (4) may be either one of alcohol structures represented by the following general formulae (5A) and (5B). The alcohol structure of the general formula (5A) is a 1-chloro-2-propanol structure or a 1-bromo-2-propanol structure, and it can be said that the carbon (methylene group) at the 3-position is bonded to the ether structure of the general formula (3) or the amine structure of the general formula (4). In addition, the alcohol structure of the general formula (5B) is a 3-chloro-1-propanol structure or a 3-bromo-1-propanol structure, and it can be said that the carbon (methine group) at the 2-position is bonded to the ether structure of the general formula (3) or the amine structure of the general formula (4).

[Chem. 9]

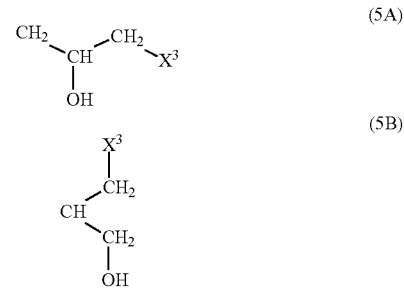

Z in the amine structure of the general formula (4) may be any one of the alcohol structures of the general formulae (5A) and (5B), or a hydrogen atom (H). Furthermore. $X^3$ in the above general formula (5A) or (5B) may each independently represent Cl or Br.

The specific production (synthesis) method of the ether/amine-based compound (D) used in the present disclosure is not particularly limited, and the ether/amine-based compound (D) can be produced by causing a compound containing a hydroxyl group or an amino group, which is the first raw material compound to react with an alkylene oxide compound having a substituent at a terminal, which is the second raw material compound, by a known method. For convenience of description, the first raw material compound of the ether/amine-based compound (D) is referred to as "raw material compound d1", and the second raw material compound of the ether/amine-based compound (D) is referred to as "raw material compound d2".

The raw material compound d1 is not particularly limited as long as it is a compound having a hydroxyl group or an amino group in the structure, and typical examples thereof include dihydric alcohols such as ethylene glycol (1,2-ethanediol), 1,2-propanediol, 1,3-propanediol, 1,2-butanediol, 1,3-butanediol, 1,4-butanediol, 2,3-butanediol, 2-methyl-1,2-propanediol, 1,5-pentanediol, 2-methyl-2,3-butanediol, 2-methyl-2,4-pentanediol, 2,3-dimethyl-2,3-butanediol, and 1,10-decanediol; phenols such as 4-tert-butylphenol, bisphenol A, bisphenol B, bisphenol C, bisphenol F, and bisphenol S; diamines such as 1,6-diaminohexane (hexamethylenediamine), m-xylylenediamine, and paraphenylenediamine; anilines such as aniline and 4,4'-methylene dianiline; novolac resins; and phenol resins.

Examples of the raw material compound d2 include a compound having an alkylene oxide structure in which a hydrogen atom bonded to a carbon atom of an alkyl group is substituted with another functional group. In the present embodiment, for example, as shown in Examples (see Table 7) described later, a compound having a propylene oxide structure in which a hydrogen atom of a methyl group at the 3-position (the hydrogen atom bonded to the carbon atom at the 3-position) is substituted with a chlorine atom (Cl), a bromine atom (Br), or another element or functional group is used.

Here, as described above, the ether/amine-based compound (D) used in the present disclosure has an alcohol structure represented by the general formula (5A) or (5B), and $X^3$ in the general formulae (5A) and (5B) each independently represent Cl or Br. Therefore, a compound containing at least chlorine or bromine may be used as the raw material compound d2, and further, a compound containing chlorine or bromine and another compound may be used in combination as the raw material compound d2.

Examples of the raw material compound d2 being a compound having the propylene oxide structure described above include epichlorohydrin and epibromohydrin. Epichlorohydrin is a compound in which one hydrogen atom (H) bonded to a carbon atom at the 3-position of propylene oxide is substituted with a chlorine atom (Cl), and epibromohydrin is a compound in which one hydrogen atom (H) bonded to a carbon atom at the 3-position of propylene oxide is substituted with a bromine atom (Br).

In Comparative Examples 3 to 6 described later, glycidol is used as the raw material compound d2, and it can be said that glycidol is a compound in which one hydrogen atom bonded to the carbon atom at the 3-position of propylene oxide is substituted with a hydroxyl group. When glycidol alone is caused to react with the raw material compound d1 as the raw material compound d2. $X^3$ of the alcohol structure in the resulting compound becomes a hydrogen atom ($X^3$ is not Cl or Br). Therefore, the resulting compound does not fall into the ether/amine-based compound (D) used in the present disclosure.

For convenience of description, a compound having a hydroxyl group in the structure among the raw material compounds d1 may be referred to as "hydroxyl group-containing compound", and a compound having an amino group in the structure among the raw material compounds d1 may be referred to as "amino group-containing compound". In addition, if the raw material compound d2 is a compound in which the hydrogen atom bonded to the carbon atom at the 3-position of propylene oxide described above is substituted, the compound may be referred to as "substituted propylene oxide compound". It is needless to say that the raw material compound d2 is not limited to the substituted propylene oxide compound described above.

The molecular weight of the ether/amine-based compound (D) may be within the range of 150 to 30,000 as described above, and may be within the range of 150 to 20,000, or may be within the range of 150 to 15,000. Considering that the ether structure of the general formula (3) or the amine structure of the general formula (4) is included and the ether structure or the amine structure has the alcohol structure represented by the general formula (5A) or (5B), it can be determined that the molecular weight of the ether/amine-based compound (D) of less than 150 is too small.

When the molecular weight of the ether/amine-based compound (D) exceeds 30,000, the effect of lowering the volume resistivity of the cured product of the conductive paste composition according to the present disclosure may not be sufficiently obtained, as is clear from Examples described later. Although it depends on the kind of the ether/amine-based compound (D), the effect of lowering the volume resistance value may be relatively high as long as the upper limit of the molecular weight is 20,000 or less or 15,000 or less.

[Method for Producing Conductive Paste Composition and Use Thereof]

The method for producing the conductive paste composition according to the present disclosure is not particularly limited, and a known method can be suitably used. As a typical example, each of the components (A) to (C) or (A), (B), and (D) described above and, if necessary, a curing agent or other components may be blended at a predetermined blending ratio (on a weight basis), and may be formed into a paste using a known kneading apparatus. Examples of the kneading apparatus include a three-roll mill.

The blending amount (content) of each of the components (A) to (C) or (A), (B), and (D) in the conductive paste composition according to the present disclosure is not particularly limited, and when the total amount of the conductive powder (A) and the resin component (B) is 100 parts by mass, the blending amount of the conductive powder (A) may be 70 parts by mass or more and 99 parts by mass or less, or may be 80 parts by mass or more and 98 parts by mass or less.

In the case where the blending amount of the conductive powder (A) is less than 70 parts by mass, the contact density between the conductive powders (A) in the cured conductive paste composition (cured product) is reduced, and the conductivity becomes insufficient due to the contact failure between the conductive powders (A), which may lead to an increase in volume resistivity. On the other hand, when the content of the conductive powder (A) is more than 99 parts by mass, the amount of the resin component (B) decreases, and the conductive powder (A) may not be uniformly dispersed.

The blending amount (addition amount, content) of the ester-based compound (C) or the ether/amine-based compound (D) may be set based on the total amount of the conductive powder (A) and the resin component (B). As described above, when the total amount of the conductive powder (A) and the resin component (B) is 100 parts by mass, the blending amount of the ester-based compound (C) or the ether/amine-based compound (D) may be 0.01 parts by mass or more and 5 parts by mass or less, or may be 0.1 parts by mass or more and 2.5 parts by mass or less.

There is a possibility that the effect of lowering the volume resistivity is obtained even when the blending amount of the ester-based compound (C) or the ether/amine-based compound (D) is less than 0.01 parts by mass depending on the composition or the like of the conductive paste composition. However, from the results shown in Examples described later, the lower limit of the blending amount of the ester-based compound (C) or ether/amine-based compound (D) is preferably 0.01 parts by mass. On the other hand, in the case where the blending amount exceeds 5 parts by mass, although it depends on the composition of the conductive paste composition, there is a possibility that an effect corresponding to the blending amount cannot be obtained, and the blending amount of the ester-based compound (C) or the ether/amine-based compound (D) is too large, which exerts some influences on the physical properties of the conductive paste composition.

The conductive paste composition according to the present disclosure may contain a solvent known in the field of the conductive paste composition and various additives in addition to the above-described components (the conductive powder (A), the resin component (B), the ester-based compound (C) or the ether/amine-based compound (D), and if necessary, the curing agent) as necessary. The additive is not particularly limited, and specific examples thereof include a leveling agent, an antioxidant, an ultraviolet absorber, a silane coupling agent, an antifoaming agent, and a viscosity modifier. These additives can be added to the extent that the effects of the present invention are not impaired.

The solvent is added to adjust physical properties, such as viscosity or fluidity, of the conductive paste composition according to the present disclosure. The physical properties of the conductive paste composition according to the present disclosure are not particularly limited, and the viscosity of the conductive paste composition may be, for example, within the range of 75 to 100 Pa·s for the convenience of forming a pattern of an electrode, an electric wiring, or the like, particularly for the efficiency of screen printing. When the viscosity of the conductive paste composition falls within this range, pattern formation by screen printing can be satisfactorily performed.

The specific kinds of the solvent are not particularly limited, and examples of the solvent include saturated hydrocarbons such as hexane; aromatic hydrocarbons such as toluene; glycol ethers (cellosolves) such as ethyl cellosolve, butyl cellosolve, and butyl cellosolve acetate; glycol ethers such as diethylene glycol diethyl ether and butyl diglycol (butyl carbitol, diethylene glycol monobutyl ether); acetate esters of glycol ethers such as butyl diglycol acetate and butyl carbitol acetate; alcohols such as diacetone alcohol, terpineol, and benzyl alcohol; ketones such as cyclohexanone and methyl ethyl ketone; and esters such as DBE, 2,2,4-trimethyl-1,3-pentanediol monoisobutyrate, and 2,2,4-trimethyl-1,3-pentanediol diisobutyrate. Only one kind of these solvents may be used, or two or more kinds of these solvents may be used in combination accordingly.

The blending amount of the solvent is not particularly limited, and as described above, the solvent can be added to such an extent that the viscosity, fluidity, or the like of the conductive paste composition can be adjusted within a suitable range. When the content of the solvent exceeds 40 mass % with respect to the entire conductive paste composition, the fluidity suitable for printing may not be obtained, and the printability may deteriorate although it depends on the kind of other components or the composition of the conductive paste composition.

A method for forming a predetermined pattern on a base material with the conductive paste composition according to the present disclosure is not particularly limited, and various known formation methods can be suitably used. Typical examples include a screen printing method as shown in the examples described later, and printing methods such as a gravure printing method, an offset printing method, an inkjet method, a dispenser method, and a dip method can also be applied.

A method for curing the conductive paste composition according to the present disclosure is not particularly limited, and a known heating method can be suitably used in accordance with various conditions such as the kind of the resin component (B). In the case where a thermosetting resin is used as the resin component (B), a known heating method may be applied under known conditions so that a temperature at which the thermosetting resin is cured is reached. In the case where a thermoplastic resin is used as the resin component (B), a known heating method may be applied under known conditions so that a temperature at which the conductive paste composition formed in a predetermined pattern can be dried and cured is reached.

In the present disclosure, a method for measuring (evaluating) the volume resistivity of the cured product of the conductive paste composition is not particularly limited, and as shown in Examples described later, the cured product (conductive layer) of the conductive paste composition is formed in a predetermined pattern on a surface of the base material, the film thickness and the electrical resistance of the cured product are measured by a known measuring device, and the volume resistivity ($\mu\Omega$·cm) of the cured product can be calculated and evaluated based on the aspect ratio based on the film thickness and the electrical resistance.

The conductive paste composition according to the present disclosure can be widely and suitably used in applications for forming a conductive cured product by being cured by heating. Typical examples include an application for forming a patterned electrode or electric wiring on abase material. Specifically, the conductive paste composition can be suitably used for, for example, a collecting electrode of a solar cell; an external electrode of a chip-type electronic component; and an electrode or an electric wiring of a component used for radio frequency identification (RFID), electromagnetic wave shield, oscillator adhesion, a membrane switch, electroluminescence, or the like.

As described above, the conductive paste composition according to the present disclosure is a "resin type" conductive paste composition (a type of a conductive paste composition cured by heating) containing a conductive powder (A) and a resin component (B), and has a configuration in which a silver-based powder containing at least silver is used as the conductive powder (A), at least one of a thermosetting resin and a thermoplastic resin is used as the resin component (B), and the ester-based compound (C) having the ester structure represented by the general formula (1) or (2) in the molecule and having a molecular weight within the range of 150 to 2000 is contained.

According to such a configuration, the volume resistivity of the cured product of the conductive paste composition can be lowered without adjusting the conditions of the silver-based powder by incorporating the ester-based compound (C) having the ester structure represented by the general formula (1) or (2) or the ether/amine-based compound (D)

having the ether structure represented by the general formula (3) or the amine structure represented by the general formula (4) into the resin type conductive paste in which the conductive powder (A) is a silver-based powder and the resin component (B) is to be heated and cured. Accordingly, the volume resistivity of the conductive layer such as an electrode or an electric wiring formed using the conductive paste composition can be made lower. In addition, for example, even when a silver-coated powder instead of a silver powder is used as the silver-based powder, the volume resistivity of the cured product can be satisfactorily lowered, and thus a conductive layer having satisfactory properties can be produced even when the amount of silver used is reduced.

As described above, the conductive paste composition according to the present disclosure may have a configuration (composition) including the conductive powder (A), the resin component (B), the ester-based compound (C), or the ether/amine-based compound (D) (and if necessary, the curing agent), and the configuration including the components (A) to (C) or the configuration including the components (A), (B), and (D) is not limited to the meaning of including only the components (A) to (C) and the curing agent if necessary or including only the components (A), (B), and (D) and the curing agent if necessary, and it is needless to say that the above-described known solvents or known additives may be added to the extent that the function and effect of the present disclosure are not directly affected.

In addition, even in the case of a substance or a compound classified into the component (A), the component (B), the component (C), or the component (D), the substance or the compound can be prevented from being contained in the conductive paste composition (blending or addition thereof can be excluded) in accordance with the function and effect of the present disclosure. Furthermore, in the present disclosure, the component (C) and the component (D) may be used in combination as long as the effects and the like of the present disclosure are not impaired. That is, the conductive paste composition according to the present disclosure may contain the components (A), (B), (C), and (D).

EXAMPLES

The present invention will be described more specifically based on Examples, Comparative Examples, and Reference Examples, but the present invention is not limited thereto. A person skilled in the art can make various changes, modifications, and modifications without departing from the scope of the present invention. The physical properties and the like in the following Examples, Comparative Examples, and Reference Examples were measured and evaluated as follows.

(Measurement and Evaluation Method)
[Average Particle Diameter of Conductive Powder]

The average particle diameter D50 of the silver-based powder as the conductive powder was evaluated according to a laser diffraction method. In a 50 ml beaker, 0.3 g of a silver-based powder sample was weighed, 30 ml of isopropyl alcohol was added thereto, and the mixture was dispersed by being treated with an ultrasonic cleaner (manufactured by As One Corporation, product name: USM-1) for 5 minutes. The dispersion liquid was used as a sample for measuring the average particle diameter D50, and the average particle diameter D50 of the silver-based powder to be dispersed in samples was measured and evaluated by a microtrack particle size distribution measuring apparatus (manufactured by Nikkiso Co., Ltd., product name: microtrack particle size distribution measuring apparatus 9320-HRA X-100).

[Evaluation of Volume Resistivity]

Conductor pattern 11 shown in FIG. 1 was printed by screen printing on a surface of an alumina substrate as a base material using the conductive paste compositions of Examples, Comparative Examples, and Reference Examples. As shown in FIG. 1, the conductor pattern 11 includes rectangular terminals 11a and 11b located at both ends, and a zigzag-shaped wiring portion 11c connecting the terminals 11a and 11b. The alumina substrate on which the conductor pattern 11 was formed was heated in a hot air dryer at 180° C. for 60 minutes to cure the conductor pattern 11 (conductive paste composition). Accordingly, a sample for evaluation of the volume resistivity was prepared.

For the samples for evaluation of Examples, Comparative Examples, and Reference Examples, the film thickness of the cured conductor pattern 11 (cured product) was measured by a surface roughness meter (manufactured by Tokyo Seimitsu Co., Ltd., product name: SURFCOM 480A), and the electrical resistance thereof was measured with a digital multimeter (manufactured by Advantest Corporation, product name: R6551). The volume resistivity (Ω-cm) of the cured product in the conductive paste composition of Examples, Comparative Examples, and Reference Examples was calculated and evaluated based on the measured film thickness and electrical resistance and the aspect ratio of the conductor pattern 11.

(Basic Composition of Conductive Paste Composition)

In the conductive paste compositions of the present Examples, Comparative Examples, and Reference Examples, four kinds of silver-based powders shown in Table 1 were used as the conductive powder (A). The average particle diameter, specific surface area (BET specific surface area), and tap density of these silver-based powders were measured and evaluated as described above.

TABLE 1

| Conductive powder (A) | | | Average particle diameter [μm] | Coating amount of silver [mass %] | Specific surface area [m²/g] | Tap density [g/cm³] |
| --- | --- | --- | --- | --- | --- | --- |
| Kind | Abbreviation | Shape | | | | |
| Silver powder 1 | A1 | Spherical | 1.1 | — | 1.5 | 3.5 |
| Silver powder 2 | A2 | Flake shape | 5.7 | — | 0.5 | 4.5 |

TABLE 1-continued

| Conductive powder (A) | | | Average particle diameter [μm] | Coating amount of silver [mass %] | Specific surface area [m$^2$/g] | Tap density [g/cm$^3$] |
|---|---|---|---|---|---|---|
| Kind | Abbreviation | Shape | | | | |
| Silver-coated copper powder | A3 | Spherical | 2.9 | 10 | 0.5 | 4.0 |
| Silver-coated resin | A4 | Spherical | 2.0 | 80 | — | — |

In the conductive paste compositions of the present Examples Comparative Examples, and Reference Examples, four kinds of resins and blocked polyisocyanates shown in Table 2 were used as the resin component (B), and two kinds of compounds shown in Table 2 were used as the curing agent of the thermosetting resin. As the solvent, butyl diglycol (abbreviation S1) shown in Table 2 was used.

TABLE 2

Resin component (B) etc.

| Kind | Abbreviation | [Manufacturer name] such as product name or compound name |
|---|---|---|
| Butyral resin | B1 | S-LEC BL-1 [manufactured by Sekisui Chemical Co., Ltd.] Molecular weight: 19,000 |
| Epoxy resin 1 | E1 | jER825 (bisphenol A type) [manufactured by Mitsubishi Chemical Corporation] Epoxy equivalent: 170 to 180 g/eq |
| Epoxy resin 2 | E2 | jER152 (phenol novolac type) [manufactured by Mitsubishi Chemical Corporation] Epoxy equivalent: 170 to 180 g/eq |
| Phenol resin | P1 | VH-4150 (bisphenol A (BPA) Novolac) [manufactured by DIC corporation] Hydroxyl group equivalent: 118 g/eq |
| Blocked polyisocyanate | U1 | Reaction compound of isocyanurate polyisocyanate of hexamethylene diisocyanate and polypropylene polyol (blocking agent: methylethylketone oxime) |
| Curing agent 1 | H1 | Boron trifluoride monomethylamine |
| Curing agent 2 | H2 | 2-ethyl-4-methyl imidazole |
| Solvent | S1 | Butyl diglycol |

(Ester-Based Compound (C))

Furthermore, in the conductive paste compositions in the present Examples, Comparative Examples, and Reference Examples, 25 kinds of compounds shown in Table 3 were used as the ester-based compound (C). As shown in Table 3, these 25 kinds of compounds were synthesized using a raw material carboxylic acid and an esterification raw material (one kind or two kinds), or using a raw material carboxylic acid, an esterification raw material, and a neutralizing agent (only the compound represented by the abbreviation C13).

These raw material compounds were charged such that the number of charged moles of the hydroxyl group of the esterification raw material was as shown in Table 3 per 1 mole of the carboxyl group of the raw material carboxylic acid, and sulfuric acid as a catalyst was charged so as to be 0.1 mass % with respect to the raw material compound (here, in the compound represented by the abbreviation C13 using a neutralizing agent, 1 mole of the hydroxyl group reacted with 1 mole in the 2 moles of the carboxyl group, and then, the remained carboxyl group was neutralized with 1 mole of the neutralizing agent to form a salt), followed by carrying out a reaction for 5 hours at a temperature within a range of 100° C. to 150° C., and thus, compounds represented by abbreviations C01 to C025 were synthesized.

A specific method of the esterification is not particularly limited, and for example, a known method described in "Organic chemistry: structure and function" can be used. In addition, the compound represented by the abbreviation C13 falls into the ester-based compound (C) having a "salt structure" because a part of the carboxyl groups of the raw material carboxylic acid are esterified with the esterification raw material and a part of the carboxyl groups are neutralized with the neutralizing agent to form a salt.

The compound represented by the abbreviation C24 does not contain chlorine (Cl) or bromine (Br) because the esterification raw material is only 1,2-propanediol. Therefore, the compound represented by the abbreviation C24 is a "comparative ester-based compound" that does not fall into the ester-based compound (C) used in the conductive paste composition according to the present disclosure.

TABLE 3

| | Ester-based compound (C) | | |
|---|---|---|---|
| | | Esterification raw material | |
| Abbreviation | Raw material carboxylic acid | Compound name | Charged amount by mole |
| C01 | Butyric acid | 3-chloro-1-propanol | 1 |
| C02 | Butyric acid | 2,3-dichloro-1-propanol | 1 |
| C03 | Oleic acid | 3-chloro-1-propanol | 1 |
| C04 | Oleic acid | 3-chloro-1,2-propanediol | 1 |
| C05 | Benzoic acid | 3-chloro-1-propanol | 1 |
| C06 | Benzoic acid | 2,3-dichloro-1-propanol | 1 |
| C07 | Benzoic acid | 3-chloro-1,2-propanediol | 1 |
| C08 | Benzoic acid | 3-bromo-1,2-propanediol | 1 |
| C09 | Succinic anhydride | 3-chloro-1-propanol | 1 |
| | | Octanol | 1 |
| C10 | Succinic anhydride | 3-chloro-1-propanol | 1 |
| | | Octyl glycol | 1 |
| C11 | Succinic anhydride | 3-chloro-1-propanol | 1 |
| | | Glycidol | 1 |
| C12 | Succinic anhydride | 2,3-dichloro-1-propanol | 2 |
| C13 | Succinic anhydride | 3-chloro-1,2-propanediol | 1 |
| | | Neutralizer: triethanolamine salts | 1 |
| C14 | Succinic anhydride | 3-chloro-1,2-propanediol | 2 |
| C15 | Malic acid | 3-chloro-1,2-propanediol | 1 |
| C16 | Adipic acid | 2,3-dichloro-1-propanol | 2 |
| C17 | Adipic acid | 3-bromo-1,2-propanediol | 2 |
| C18 | Phthalic anhydride | 3-chloro-1-propanol | 2 |
| C19 | Phthalic anhydride | 3-chloro-1,2-propanediol | 1 |
| C20 | Hexahydrophthalic acid anhydride | 3-chloro-1-propanol | 1 |
| C21 | Hexahydrophthalic acid anhydride | 3-chloro-1,2-propanediol | 2 |
| C22 | Pyromellitic anhydride | 3-chloro-1-propanol | 3 |
| C23 | Ethylenediaminetetraacetic acid | 3-chloro-1,2-propanediol | 4 |
| C24 | Succinic anhydride | 1,2-propanediol | 2 |
| C25 | Styrene-maleic acid copolymer*[1] | 3-chloro-1-propanol | (Equal mole)*[2] |

*[1]Styrene-maleic acid copolymer: manufactured by CRAY VALLEY USA, LLC, product name SMA® 1000
*[2]Add in equal mole with respect to carboxyl group of styrene-maleic acid copolymer The conductive paste compositions in the present Examples, Comparative Examples, and Reference Examples were prepared (produced) so as to have four basic compositions shown in Table 4.

Specifically, as shown in Table 4, 90 parts by mass of the conductive powder (A), 10 parts by mass of the resin component (B), and, if necessary, 0.5 parts by mass of the curing agent were blended, and the ester-based compound (C) was blended in the blending amount shown in Table 5 or 6, and the resulting mixture was kneaded by a three-roll mill. In this case, as shown in Table 4, the kind of the conductive powder (A) (silver-based powder), the kinds of the resin component (B) and curing agent, and the mixing ratio thereof were different in the composition 1 to the composition 4.

Thereafter, butyl diglycol (abbreviation S1) was added as a solvent to adjust the viscosity to 100 Pa-s (1 rpm). Accordingly, the conductive paste compositions of Examples and Comparative Examples were prepared (produced). The conductive paste compositions of Reference Examples had a composition in which the ester-based compound (C) was not blended with the compositions 1 to 4.

TABLE 4

| | | Basic composition of conductive paste composition | | | |
|---|---|---|---|---|---|
| Component | | Composition 1 | Composition 2 | Composition 3 | Composition 4 |
| Conductive powder (A) | Abbreviation | A1 | A1 | A1 | — |
| | Mass ratio | 100 | 50 | 50 | — |
| | Abbreviation | — | A2 | A3 | A4 |
| | Mass ratio | — | 50 | 50 | 100 |
| Resin component (B) | Abbreviation | B1 | E1 | E1 | E2 |
| | Mass ratio | 100 | 60 | 60 | 100 |
| | Abbreviation | — | U1 | P1 | — |
| | Mass ratio | — | 40 | 40 | — |

TABLE 4-continued

| | Basic composition of conductive paste composition | | | |
|---|---|---|---|---|
| Component | Composition 1 | Composition 2 | Composition 3 | Composition 4 |
| Curing agent Abbreviation | — | H1 | H2 | H2 |
| [phr: per hundred resin] Addition amount | — | 5 phr | 5 phr | 5 phr |
| Mixing ratio of (A)/(B) [mass ratio] | 93/7 | 93/7 | 93/7 | 93/7 |
| Solvent | S1 | S1 | S1 | S1 |

Reference Example 1

As shown in Table 5, a conductive paste composition of Reference Example 1, which had only the basic composition of Composition 1 and did not contain an ester-based compound (C), was prepared. Using the conductive paste composition of Reference Example 1, a sample for evaluation was prepared as described above, and the volume resistivity of the cured product was measured. The results are shown in Table 5.

Example 1

As shown in Table 5, a conductive paste composition of Example 1 was prepared by blending 1 part by mass of a compound represented by an abbreviation C01 as an ester-based compound (C) with respect to the basic composition of Composition 1. Using the conductive paste composition of Example 1, a sample for evaluation was prepared as described above, and the volume resistivity of the cured product was measured. The result is shown in Table 5.

Examples 2 to 23

As shown in Table 5, conductive paste compositions of Examples 2 to 23 were prepared by blending 1 part by mass of the compounds represented by abbreviations C02 to C23 (only the compound represented by the abbreviation C13 had a salt structure) as the ester-based compound (C) with respect to the basic composition of Composition 1, respectively. Using each of the conductive paste compositions of Examples 2 to 23, a sample for evaluation was prepared as described above, and the volume resistivity of the cured product was measured. The results are shown in Table 5.

Comparative Example 1

As shown in Table 5, a conductive paste composition of Comparative Example 1 was prepared by blending 1 part by mass of the compound represented by the abbreviation C24, which was a comparative ester-based compound, with respect to the basic composition of the composition 1. Using the conductive paste composition of Comparative Example 1, a sample for evaluation was prepared as described above, and the volume resistivity of the cured product was measured. The results are shown in Table 5.

Example 24

As shown in Table 5, a conductive paste composition of Example 24 was prepared by blending 1 part by mass of a compound represented by an abbreviation C25 as an ester-based compound (C) with respect to the basic composition of Composition 1. The compound represented by the abbreviation C25 has a weight average molecular weight of about 1000 to 1500 because the raw material carboxylic acid is a styrene-maleic acid copolymer. Using the conductive paste composition of Example 24, a sample for evaluation was prepared as described above, and the volume resistivity of the cured product was measured. The results are shown in Table 5.

TABLE 5

| | | Ester-based compound (C) | | |
|---|---|---|---|---|
| | Basic composition | Kind [Abbreviation] | Blending amount [parts by mass] | Volume resistivity [$\mu\Omega \cdot cm$] |
| Reference Example 1 | Composition 1 | — | 0 | 20 |
| Example 1 | Composition 1 | C01 | 1 | 14 |
| Example 2 | Composition 1 | C02 | 1 | 13 |
| Example 3 | Composition 1 | C03 | 1 | 12 |
| Example 4 | Composition 1 | C04 | 1 | 12 |
| Example 5 | Composition 1 | C05 | 1 | 12 |
| Example 6 | Composition 1 | C06 | 1 | 11 |
| Example 7 | Composition 1 | C07 | 1 | 11 |
| Example 8 | Composition 1 | C08 | 1 | 12 |
| Example 9 | Composition 1 | C09 | 1 | 13 |
| Example 10 | Composition 1 | C10 | 1 | 13 |
| Example 11 | Composition 1 | C11 | 1 | 12 |
| Example 12 | Composition 1 | C12 | 1 | 10 |
| Example 13 | Composition 1 | C13 | 1 | 11 |
| Example 14 | Composition 1 | C14 | 1 | 11 |
| Example 15 | Composition 1 | C15 | 1 | 11 |
| Example 16 | Composition 1 | C16 | 1 | 10 |

TABLE 5-continued

| | Basic composition | Ester-based compound (C) Kind [Abbreviation] | Blending amount [parts by mass] | Volume resistivity [μΩ · cm] |
|---|---|---|---|---|
| Example 17 | Composition 1 | C17 | 1 | 12 |
| Example 18 | Composition 1 | C18 | 1 | 10 |
| Example 19 | Composition 1 | C19 | 1 | 11 |
| Example 20 | Composition 1 | C20 | 1 | 11 |
| Example 21 | Composition 1 | C21 | 1 | 10 |
| Example 22 | Composition 1 | C22 | 1 | 12 |
| Example 23 | Composition 1 | C23 | 1 | 12 |
| Comparative Example 1 | Composition 1 | C24 | 1 | 20 |
| Example 24 | Composition 1 | C25 | 1 | 19 |

Reference Example 2

As shown in Table 6, a conductive paste composition of Reference Example 2, which had only the basic composition of Composition 2 and did not contain an ester-based compound (C), was prepared. Using the conductive paste composition of Reference Example 2, a sample for evaluation was prepared as described above, and the volume resistivity of the cured product was measured. The result is shown in Table 6.

Examples 25 to 28

As shown in Table 6, conductive paste compositions of Examples 25 to 28 were prepared by blending the compound represented by the abbreviation C05 as the ester-based compound (C) in a range of 0.05 to 5 parts by mass with respect to the basic composition of Composition 2. Using the conductive paste compositions of Examples 25 to 28 respectively, a sample for evaluation was prepared as described above, and the volume resistivity of the cured product was measured. The results are shown in Table 6.

Examples 29 to 32

As shown in Table 6, conductive paste compositions of Examples 29 to 32 were prepared by blending the compound represented by the abbreviation C15 as the ester-based compound (C) in a range of 0.01 to 2.5 parts by mass with respect to the basic composition of Composition 2. Using the conductive paste compositions of Examples 29 to 32 respectively, a sample for evaluation was prepared as described above, and the volume resistivity of the cured product was measured. The results are shown in Table 6.

Reference Example 3

As shown in Table 6, a conductive paste composition of Reference Example 3, which had only the basic composition of Composition 3 and did not contain an ester-based compound (C), was prepared. Using the conductive paste composition of Reference Example 3, a sample for evaluation was prepared as described above, and the volume resistivity of the cured product was measured. The results are shown in Table 6.

Examples 33 to 37

As shown in Table 6, conductive paste compositions of Examples 33 to 37 were prepared by respectively blending 0.5 parts by mass of compounds represented by abbreviations C08, C15, C17, C19, and C21 as an ester-based compound (C) with respect to the basic composition of Composition 3. Using the conductive paste compositions of Examples 33 to 37 respectively, a sample for evaluation was prepared as described above, and the volume resistivity of the cured product was measured. The results are shown in Table 6.

Comparative Example 2

As shown in Table 6, a conductive paste composition of Comparative Example 2 was prepared by blending 0.5 parts by mass of a compound represented by the abbreviation C24, which was a comparative ester-based compound, with respect to the basic composition of Composition 3. Using the conductive paste composition of Comparative Example 2, a sample for evaluation was prepared as described above, and the volume resistivity of the cured product was measured. The result is shown in Table 6.

Reference Example 4

As shown in Table 6, a conductive paste composition of Reference Example 4, which had only the basic composition of Composition 4 and did not contain an ester-based compound (C), was prepared. Using the conductive paste composition of Reference Example 4, a sample for evaluation was prepared as described above, and the volume resistivity of the cured product was measured. The result is shown in Table 6.

Examples 38 to 45

As shown in Table 6, conductive paste compositions of Examples 38 to 45 were prepared by respectively blending 1 part by mass of compounds represented by the abbreviations C09 to C15 and C25 (only the compound of the abbreviation C13 had a salt structure) as an ester-based compound (C) with respect to the basic composition of Composition 4. Using the conductive paste compositions of Examples 38 to 45 respectively, a sample for evaluation was prepared as described above, and the volume resistivity of the cured product was measured. The results are shown in Table 6.

TABLE 6

| | Basic composition | Ester-based compound (C) Kind [Abbreviation] | Blending amount [parts by mass] | Volume resistivity [μΩ · cm] |
|---|---|---|---|---|
| Reference Example 2 | Composition 2 | — | 0 | 15 |
| Example 25 | Composition 2 | C05 | 0.05 | 10 |
| Example 26 | Composition 2 | C05 | 0.1 | 8 |
| Example 27 | Composition 2 | C05 | 1 | 7 |
| Example 28 | Composition 2 | C05 | 5 | 10 |
| Example 29 | Composition 2 | C15 | 0.01 | 12 |
| Example 30 | Composition 2 | C15 | 0.1 | 7 |
| Example 31 | Composition 2 | C15 | 0.5 | 7 |
| Example 32 | Composition 2 | C15 | 2.5 | 8 |
| Reference Example 3 | Composition 3 | — | 0 | 30 |
| Example 33 | Composition 3 | C08 | 0.5 | 20 |
| Example 34 | Composition 3 | C15 | 0.5 | 15 |
| Example 35 | Composition 3 | C17 | 0.5 | 15 |
| Example 36 | Composition 3 | C19 | 0.5 | 15 |
| Example 37 | Composition 3 | C21 | 0.5 | 15 |
| Comparative Example 2 | Composition 3 | C24 | 0.5 | 30 |
| Reference Example 4 | Composition 4 | — | 0 | 100 |
| Example 38 | Composition 4 | C09 | 1 | 65 |
| Example 39 | Composition 4 | C10 | 1 | 65 |
| Example 40 | Composition 4 | C11 | 1 | 60 |
| Example 41 | Composition 4 | C12 | 1 | 50 |
| Example 42 | Composition 4 | C13 | 1 | 55 |
| Example 43 | Composition 4 | C14 | 1 | 55 |
| Example 44 | Composition 4 | C15 | 1 | 55 |
| Example 45 | Composition 4 | C25 | 1 | 90 |

Comparison Between Examples, Comparative Examples, and Reference Examples

As is clear from the comparison between Examples 1 to 45 and Reference Examples 1 to 4, the volume resistivity of the obtained conductor pattern 11 (conductive layer) is satisfactorily lowered in the case of the conductive paste compositions of Examples containing the ester-based compound (C), as compared with the conductive paste compositions of Reference Examples which do not contain the ester-based compound (C).

As is clear from the comparison between Examples 1 to 24, Comparative Example 1, and Reference Example 1, and the comparison between Examples 33 to 37, Comparative Example 2, and Reference Example 3, in the case of the conductive paste composition of Comparative Example 1 or 2 containing the comparative ester-based compound, the volume resistivity of the obtained conductor pattern 11 is the same as that of the conductive paste composition of Reference Example 1 or 3 in terms of the volume efficiency. Therefore, it can be seen that the ester-based compound (C) with an ester structure having 3 carbon atoms that contains chlorine (Cl) or bromine (Br) can contribute to a decrease in volume resistivity, rather than the compound with an ester structure merely having 3 carbon atoms.

In addition, as is clear from the comparison between Example 13 and Example 14 or the comparison between Example 42 and Example 43, it can be seen that the ester-based compound (C) contributes to a decrease in the volume resistivity regardless of whether the ester-based compound (C) contains the "salt structure" (the compound represented by the abbreviation C13) or not (the compound represented by the abbreviation C14).

As is clear from the comparison between Reference Examples 1 and 2 and Reference Example 3, the volume resistivity of the conductor pattern 11 is relatively high when not only the silver powder but also the silver-coated copper powder is used in combination as the conductive powder (A). However, as is clear from the comparison between Examples 1 to 32 and Examples 33 to 37, by adjusting the kind or the blending amount (addition amount) of the compound used as the ester-based compound (C), it can be expected that a volume resistivity as low as that in the case of silver powder alone can be realized even when silver-coated copper powder is used in combination.

Similarly, as is clear from the comparison between Reference Examples 1 to 3 and Reference Example 4, the volume resistivity of the conductor pattern 11 is considerably high when a silver-coated resin powder is used as the conductive powder (A) instead of a silver powder or the like. However, as is clear from the results of Examples 38 to 44, it can be seen that the volume resistivity can be significantly lowered by using the ester-based compound (C).

As is clear from the comparison between Examples 1 to 23, Reference Example 1, and Example 24, and the comparison between Examples 38 to 44, Reference Example 4, and Example 45, the volume resistivity can be lowered even when the molecular weight of the ester-based compound (C) is approximately 1000 to 1500. In this case, according to the results of Example 24 and Example 45, the degree of decrease in volume resistivity is relatively small as compared with a compound having a lower molecular weight, and thus, it can be seen that the upper limit of the molecular weight of the ester-based compound (C) is preferably approximately 2,000 in consideration of this point. Therefore, it can be seen that the molecular weight of the ester-based compound (C) is preferably within the range of 150 to 2000.

(Ether/Amine-Based Compound (D))

In the conductive paste compositions of the present Examples, Comparative Examples, and Reference Examples, 20 kinds of compounds shown in Table 7 were used as the ether/amine-based compound (D). These 20 kinds of compounds were synthesized by using a hydroxyl group-containing compound or an amino group-containing compound as the raw material compound d1 and a substituted propylene oxide compound as the raw material compound d2, as shown in Table 7.

The raw material compound d2 was charged with respect to 1 mol of a hydroxyl group or an amino group of the raw material compound d1. When the raw material compound d1 was a hydroxyl group-containing compound, sulfuric acid was charged as a catalyst to reach a content of 0.1 mass % relative to the hydroxyl group-containing compound, and when the raw material compound d1 was an amino group-containing compound, no catalyst was added, followed by carrying out a reaction within a temperature range of 60° C. to 120° C. for 3 to 5 hours, thereby synthesizing the compounds represented by abbreviations D01 to D20.

When the raw material compound d2 is a substituted propylene oxide compound, the specific method of the ring-opening reaction of the substituted propylene oxide compound is not particularly limited, and for example, a known method described in "Organic chemistry: structure and function" can be used. In the ring-opening reaction, an aprotic solvent may be used as necessary.

The compound represented by the abbreviation D19 or D20 does not contain chlorine (Cl) or bromine (Br) because the raw material compound d2 is glycidol alone. Therefore, the compound represented by the abbreviation D19 or D20 is a "comparative ether/amine-based compound" that does not fall into the ether/amine-based compound (D) used in the conductive paste composition according to the present disclosure.

TABLE 7

Ether/amine-based compound (D)

| | | Raw material compound d2 | |
|---|---|---|---|
| Abbreviation | Raw material compound d1 | Compound name | Charged amount by mole |
| D01 | Ethylene glycol | Epichlorohydrin | 0.5 |
| D02 | 2-methyl-2,4-pentanediol | Epichlorohydrin | 1 |
| D03 | 1,10-decanediol | Epichlorohydrin | 1 |
| D04 | 4-tert-butylphenol | Epichlorohydrin | 1 |
| D05 | Bisphenol F | Epichlorohydrin | 1 |
| D06 | Bisphenol A | Epichlorohydrin | 1 |
| D07 | Bisphenol A | Epibromohydrin | 1 |
| D08 | Bisphenol S | Epichlorohydrin | 1 |
| D09 | 1,6-diaminohexane | Epichlorohydrin | 2 |
| D10 | Aniline | Epichlorohydrin | 2 |
| D11 | 4,4'-methylene dianiline | Epichlorohydrin | 2 |
| D12 | m-xylylenediamine | Epichlorohydrin | 2 |
| D13 | DL-92 (product name*[1]) | Epichlorohydrin | 1 |
| D14 | MEHC-7800 (product name*[2]) | Epichlorohydrin | 1 |
| D15 | MEH-7500 (product name*[3]) | Epibromohydrin | 0.5 |
| D16 | PHENOLITE VH-4150 (product name*[4]) | Epichlorohydrin | 1 |
| D17 | PHENOLITE KA-1165 (product name*[5]) | Epibromohydrin | 0.5 |

TABLE 7-continued

Ether/amine-based compound (D)

| | | Raw material compound d2 | |
|---|---|---|---|
| Abbreviation | Raw material compound d1 | Compound name | Charged amount by mole |
| D18 | S-LEC BL-1H (product name*[6]) | Epichlorohydrin | 0.8 |
| D19 | Bisphenol A | Glycidol | 1 |
| D20 | m-xylylenediamine | Glycidol | 2 |

*[1]Manufactured by Meiwa Plastic Industries, Ltd., hydroxyl group equivalent = 103 to 109 g/eq
*[2]Manufactured by Meiwa Plastic Industries, Ltd., hydroxyl group equivalent = 167 to 180 g/eq
*[3]Manufactured by Meiwa Plastic Industries, Ltd., hydroxyl group equivalent = 95 to 99 g/eq
*[4]Manufactured by DIC Corporation, hydroxyl group equivalent = 118 g/eq
*[5]Manufactured by DIC Corporation, hydroxyl group equivalent = 119 g/eq
*[6]Manufactured by Sekisui Chemical Co., Ltd., molecular weight = 20,000, hydroxyl group = 30 mol %

As described above, the conductive paste compositions in the present Examples, Comparative Examples, and Reference Examples were prepared (produced) so as to have four kinds of basic compositions shown in Table 4. Since the specific preparation (production) method is as described above, the description thereof will be omitted.

Reference Example 5

As shown in Table 8, a conductive paste composition of Reference Example 5, which had only the basic composition of Composition 1 and did not contain an ether/amine-based compound (D), was prepared. Using the conductive paste composition of Reference Example 5, a sample for evaluation was prepared as described above, and the volume resistivity of the cured product was measured. The result is shown in Table 8.

Example 46

As shown in Table 8, a conductive paste composition of Example 46 was prepared by blending 1 part by mass of a compound represented by an abbreviation D01 as an ether/amine-based compound (D) with respect to the basic composition of Composition 1. Using the conductive paste composition of Example 46, a sample for evaluation was prepared as described above, and the volume resistivity of the cured product was measured. The result is shown in Table 8.

Examples 47 to 63

As shown in Table 8, conductive paste compositions of Examples 47 to 63 were prepared by blending 1 part by mass of each of compounds represented by abbreviations D02 to D18 as an ether/amine-based compound (D) with respect to the basic composition of Composition 1. Using the conductive paste compositions of Examples 47 to 63 respectively, a sample for evaluation was prepared as described above, and the volume resistivity of the cured product was measured. The results are shown in Table 8.

Comparative Examples 3 and 4

As shown in Table 8, a conductive paste composition of Comparative Example 3 or Comparative Example 4 was prepared by blending 1 part by mass of a compound represented by an abbreviation D19 or D20, which is a comparative ether/amine-based compound, with respect to the basic composition of Composition 1. Using the conductive paste composition of Comparative Example 3 or Comparative Example 4, a sample for evaluation was prepared as described above, and the volume resistivity of the cured product was measured. The results are shown in Table 8.

TABLE 8

| | | Ether/amine-based compound (D) | | |
|---|---|---|---|---|
| | Basic composition | Kind [Abbreviation] | Blending amount [parts by mass] | Volume resistivity [μΩ · cm] |
| Reference Example 5 | Composition 1 | — | 0 | 20 |
| Example 46 | Composition 1 | D01 | 1 | 14 |
| Example 47 | Composition 1 | D02 | 1 | 11 |
| Example 48 | Composition 1 | D03 | 1 | 11 |
| Example 49 | Composition 1 | D04 | 1 | 10 |
| Example 50 | Composition 1 | D05 | 1 | 10 |
| Example 51 | Composition 1 | D06 | 1 | 10 |
| Example 52 | Composition 1 | D07 | 1 | 10 |
| Example 53 | Composition 1 | D08 | 1 | 12 |
| Example 54 | Composition 1 | D09 | 1 | 11 |
| Example 55 | Composition 1 | D10 | 1 | 10 |
| Example 56 | Composition 1 | D11 | 1 | 10 |
| Example 57 | Composition 1 | D12 | 1 | 10 |
| Example 58 | Composition 1 | D13 | 1 | 12 |
| Example 59 | Composition 1 | D14 | 1 | 12 |
| Example 60 | Composition 1 | D15 | 1 | 14 |
| Example 61 | Composition 1 | D16 | 1 | 12 |
| Example 62 | Composition 1 | D17 | 1 | 14 |
| Example 63 | Composition 1 | D18 | 1 | 13 |
| Comparative Example 3 | Composition 1 | D19 | 1 | 20 |
| Comparative Example 4 | Composition 1 | D20 | 1 | 20 |

Reference Example 6

As shown in Table 9, a conductive paste composition of Reference Example 6, which had only the basic composition of Composition 2 and did not contain an ether/amine-based compound (D), was prepared. Using the conductive paste composition of Reference Example 6, a sample for evaluation was prepared as described above, and the volume resistivity of the cured product was measured. The result is shown in Table 9.

Examples 64 to 67

As shown in Table 9, conductive paste compositions of Examples 64 to 67 were prepared by blending a compound represented by an abbreviation D04 as an ether/amine-based compound (D) in a range of 0.05 to 5 parts by mass with respect to the basic composition of Composition 2. Using the conductive paste compositions of Examples 64 to 67 respectively, a sample for evaluation was prepared as described above, and the volume resistivity of the cured product was measured. The result is shown in Table 9.

Examples 68 to 71

As shown in Table 9, conductive paste compositions of Examples 68 to 71 were prepared by blending a compound represented by an abbreviation D06 as an ether/amine-based compound (D) in a range of 0.01 to 2.5 parts by mass with respect to the basic composition of Composition 2. Using the conductive paste compositions of Examples 68 to 71 respectively, a sample for evaluation was prepared as described above, and the volume resistivity of the cured product was measured. The results are shown in Table 9.

Reference Example 7

As shown in Table 9, a conductive paste composition of Reference Example 7, which had only the basic composition of Composition 3 and did not contain an ether/amine-based compound (D), was prepared. Using the conductive paste composition of Reference Example 7, a sample for evaluation was prepared as described above, and the volume resistivity of the cured product was measured. The result is shown in Table 9.

Examples 72 to 76

As shown in Table 9, conductive paste compositions of Examples 72 to 76 were prepared by blending 0.5 parts by mass of each of the compounds represented by abbreviations D04, D05, D13, D16, and D18 as an ether/amine-based compound (D) with respect to the basic composition of Composition 3. Using the conductive paste compositions of Examples 72 to 76 respectively, a sample for evaluation was prepared as described above, and the volume resistivity of the cured product was measured. The results are shown in Table 9.

Comparative Example 5

As shown in Table 9, a conductive paste composition of Comparative Example 5 was prepared by blending 0.5 parts by mass of a compound represented by an abbreviation D19, which is a comparative ether/amine-based compound, with respect to the basic composition of Composition 3. Using the conductive paste composition of Comparative Example 5, a sample for evaluation was prepared as described above, and the volume resistivity of the cured product was measured. The result is shown in Table 9.

Reference Example 8

As shown in Table 9, a conductive paste composition of Reference Example 8, which had only the basic composition of Composition 4 and did not contain an ether/amine-based compound (D), was prepared. Using the conductive paste composition of Reference Example 8, a sample for evaluation was prepared as described above, and the volume resistivity of the cured product was measured. The result is shown in Table 9.

Examples 77 to 83

As shown in Table 9, conductive paste compositions of Examples 77 to 83 were prepared by blending 1 part by mass of each of the compounds represented by abbreviations D02, D06, D08, D09, and D10 to D12 as an ether/amine-based compound (D) with respect to the basic composition of Composition 4. Using the conductive paste compositions of Examples 77 to 83 respectively, a sample for evaluation was prepared as described above, and the volume resistivity of the cured product was measured. The results are shown in Table 9.

Comparative Example 6

As shown in Table 9, a conductive paste composition of Comparative Example 6 was prepared by blending 0.5 parts by mass of a compound represented by an abbreviation D20, which is a comparative ether/amine-based compound, with respect to the basic composition of Composition 4. Using the conductive paste composition of Comparative Example 6, a sample for evaluation was prepared as described above, and the volume resistivity of the cured product was measured. The result is shown in Table 9.

TABLE 9

|  | Basic composition | Ether/amine-based compound (D) | | | Volume resistivity [$\mu\Omega \cdot$ cm] |
|---|---|---|---|---|---|
|  |  | Kind [Abbreviation] | Blending amount [parts by mass] | | |
| Reference Example 6 | Composition 2 | — | 0 | | 15 |
| Example 64 | Composition 2 | D04 | 0.05 | | 10 |
| Example 65 | Composition 2 | D04 | 0.1 | | 8 |
| Example 66 | Composition 2 | D04 | 1 | | 7 |
| Example 67 | Composition 2 | D04 | 5 | | 10 |
| Example 68 | Composition 2 | D06 | 0.01 | | 12 |
| Example 69 | Composition 2 | D06 | 0.1 | | 7 |
| Example 70 | Composition 2 | D06 | 0.5 | | 7 |
| Example 71 | Composition 2 | D06 | 2.5 | | 8 |
| Reference Example 7 | Composition 3 | — | 0 | | 30 |
| Example 72 | Composition 3 | D04 | 0.5 | | 15 |
| Example 73 | Composition 3 | D05 | 0.5 | | 15 |
| Example 74 | Composition 3 | D13 | 0.5 | | 18 |
| Example 75 | Composition 3 | D16 | 0.5 | | 18 |
| Example 76 | Composition 3 | D18 | 0.5 | | 20 |
| Comparative Example 5 | Composition 3 | D19 | 0.5 | | 30 |
| Reference Example 8 | Composition 4 | — | 0 | | 100 |
| Example 77 | Composition 4 | D02 | 1 | | 70 |
| Example 78 | Composition 4 | D06 | 1 | | 50 |
| Example 79 | Composition 4 | D08 | 1 | | 60 |
| Example 80 | Composition 4 | D09 | 1 | | 55 |
| Example 81 | Composition 4 | D10 | 1 | | 50 |
| Example 82 | Composition 4 | D11 | 1 | | 50 |
| Example 83 | Composition 4 | D12 | 1 | | 50 |
| Comparative Example 6 | Composition 4 | D20 | 1 | | 100 |

Comparison Among Examples, Comparative Examples, and Reference Examples

As is clear from the comparison between Examples 46 to 83 and Reference Examples 5 to 8, the volume resistivity of the obtained conductor pattern 11 (conductive layer) is satisfactorily lowered in the case of the conductive paste compositions of Examples containing an ether/amine-based compound (D), as compared with the conductive paste compositions of Reference Examples which do not contain an ether/amine-based compound (D).

As is clear from the comparison between Examples 46 to 83, Comparative Examples 3 and 4, and Reference Example 5, the comparison between Examples 72 to 76, Comparative Example 5, and Reference Example 7, and the comparison between Examples 77 to 83, Comparative Example 6, and Reference Example 8, in the case of the conductive paste compositions of Comparative Examples 3 to 6 containing the comparative ether/amine-based compound, the volume resistivity of the obtained conductor pattern 11 is the same as that of the conductive paste compositions of Reference Example 5, 7, or 8 in terms of the volume efficiency. Therefore, it can be seen that an ether/amine-based compound (D) in which $X^3$ in the alcohol structure represented by the general formula (5A) or (5B) described above is chlorine (Cl) or bromine (Br) can contribute to a decrease in the volume resistivity, rather than a comparative ether/amine-based compound in which $X^3$ is a hydrogen atom.

As is clear from the comparison between Reference Examples 5 and 6 and Reference Example 7, the volume resistivity of the conductor pattern 11 is relatively high when not only the silver powder but also the silver-coated copper powder is used in combination as the conductive powder (A). However, as is clear from the comparison between Examples 46 to 71 and Examples 72 to 76, by adjusting the kind or the blending amount (addition amount) of the compound used as the ether/amine-based compound (D), it can be expected that a volume resistivity as low as that in the case of silver powder alone can be realized even when silver-coated copper powder is used in combination.

Similarly, as is clear from the comparison between Reference Examples 5 to 7 and Reference Example 8, the volume resistivity of the conductor pattern 11 is considerably high when a silver-coated resin powder is used as the conductive powder (A) instead of a silver powder or the like. However, as is clear from the results of Examples 77 to 83, it can be seen that the volume resistivity can be significantly lowered by using the ether/amine-based compound (D).

The present invention is not limited to the embodiments described above, and various modifications can be made without departing from the scope of the claims, and embodiments obtained by appropriately combining technical means disclosed in different embodiments and modified examples are also included in the technical scope of the present invention.

INDUSTRIAL APPLICABILITY

The present invention can be suitably used in the field of manufacturing various electronic devices and electronic components, and in particular, can be suitably used in the field in which it is required to form an electrode and a wiring with higher definition, such as a collecting electrode of a solar cell, an external electrode of a chip-type electronic component, an electrode and a wiring of components used for RFID, electromagnetic wave shield, oscillator adhesion, a membrane switch, electroluminescence, or the like.

REFERENCE SIGNS LIST

11: Conductor pattern
11a: Terminal
11b: Terminal
11c: Wiring portion

The invention claimed is:

1. A conductive paste composition, comprising a conductive powder (A) and a resin component (B), wherein a silver-based powder containing at least silver is used as the conductive powder (A), at least one of a thermosetting resin and a thermoplastic resin is used as the resin component (B), and the conductive paste composition further contains an ester-based compound (C) or an ether/amine-based compound (D), the ester-based compound (C) having an ester structure represented by the following general formula (1) or (2) in a molecule thereof and having a molecular weight within a range of 150 to 2000,

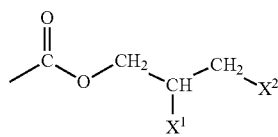

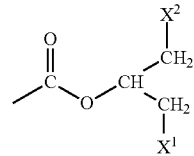

in which either one of $X^1$ and $X^2$ in the ester structure of the above general formula (1) or (2) represents Cl or Br, and the other one represents Cl, Br, H, or OH, and the ether/amine-based compound (D) having an ether structure represented by the following general formula (3) or an amine structure represented by the following general formula (4) in a molecule thereof and having a molecular weight within the range of 150 to 30,000,

in which Y in the ether structure of the above general formula (3) or the amine structure of the above general formula (4) represents either one of alcohol structures represented by the following general formulae (5A) and (5B),

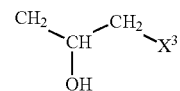

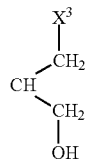

Z in the amine structure of the above general formula (4) is either one of the alcohol structures represented by the general formulae (5A) and (5B), or a hydrogen atom (H), and X in the general formulae (5A) and (5B) each independently represent Cl or Br.

2. The conductive paste composition according to claim 1, wherein when a total amount of the conductive powder (A) and the resin component (B) is 100 parts by mass, a content of the ester-based compound (C) or a salt thereof or the ether/amine-based compound (D) is 0.01 parts by mass or more and 5 parts by mass or less.

3. The conductive paste composition according to claim 2, wherein the content of the ester-based compound (C) or a salt thereof, or the ether/amine-based compound (D) is 0.1 parts by mass or more and 2.5 parts by mass or less.

4. The conductive paste composition according to claim 1, wherein the silver-based powder is at least one of a silver powder and a silver-coated powder.

5. The conductive paste composition according to claim 1, wherein the ester-based compound (C) contains the ester-based compound (C) having a salt structure in which a part of the ester structure of the ester-based compound (C) is a salt structure formed by neutralizing a carboxylic acid by a base instead of an ester.

6. The conductive paste composition according to claim 1, wherein the resin component (B) is at least one selected from a butyral resin, an epoxy resin, and a phenol resin.

* * * * *